(12) United States Patent
Yao et al.

(10) Patent No.: US 8,092,268 B2
(45) Date of Patent: Jan. 10, 2012

(54) REPAIRING METHODS OF PIXEL STRUCTURE AND ORGANIC ELECTRO-LUMINESCENCE DISPLAYING UNIT

(75) Inventors: Chih-Wen Yao, Hsinchu (TW); Hsin-Hung Lee, Taipei (TW)

(73) Assignee: Au Optronics Corporation, Hsinchu (TW)

( * ) Notice: Subject to any disclaimer, the term of this patent is extended or adjusted under 35 U.S.C. 154(b) by 226 days.

(21) Appl. No.: 12/575,474

(22) Filed: Oct. 8, 2009

(65) Prior Publication Data

US 2010/0022153 A1 Jan. 28, 2010

Related U.S. Application Data

(62) Division of application No. 11/309,018, filed on Jun. 9, 2006, now Pat. No. 7,642,710.

(30) Foreign Application Priority Data

Jan. 2, 2006 (TW) .............................. 95100056 A

(51) Int. Cl.
*H01L 21/00* (2006.01)
*H01J 9/50* (2006.01)

(52) U.S. Cl. ...................... 445/2; 445/24; 438/4; 438/12
(58) Field of Classification Search .................. 445/24, 445/2, 3; 315/169.1–169.4; 438/4, 12
See application file for complete search history.

(56) References Cited

U.S. PATENT DOCUMENTS 5,392,143 A * 2/1995 Akiyama et al. ................ 349/55
6,979,956 B2 * 12/2005 Park et al. .................. 315/169.3

* cited by examiner

*Primary Examiner* — Mariceli Santiago
(74) *Attorney, Agent, or Firm* — Jianq Chyun IP Office

(57) ABSTRACT

The invention provides a method of repairing the pixel structure, and the method includes the following. First, an electrical connection between the current control unit and the power line is cut. The power line is then electrically connected to the redundant active device, so that the current control unit and the redundant active device control the current provided by the power line. The invention provides a method of repairing the organic electro-luminescence display unit, suitable for repairing the above-mentioned organic electro-luminescence display unit, and the method includes the following. First, an electrical connection between the current control unit and the power line is cut. The power line is electrically connected to the redundant active device, so that the current control unit and the redundant active device control the current passing through the organic electro-luminescence layer.

6 Claims, 16 Drawing Sheets

REPAIRING METHODS OF PIXEL STRUCTURE AND ORGANIC ELECTRO-LUMINESCENCE DISPLAYING UNIT

CROSS-REFERENCE TO RELATED APPLICATION

This application is a divisional application of and claims priority benefit of an application Ser. No. 11/309,018, filed on Jun. 9, 2006, now allowed, which claims the priority benefit of Taiwan application serial no. 95100056, filed on Jan. 2, 2006. The entirety of each of the above-mentioned patent applications is hereby incorporated by reference herein and made a part of this specification.

BACKGROUND OF THE INVENTION

1. Field of Invention

The invention relates to a pixel structure and a repairing method thereof. More particularly, the invention relates to an organic electro-luminescence displaying unit and a repairing method thereof.

2. Description of Related Art

The rapid progress of the multiple media industry mostly benefits from the rapid development of semiconductors or display devices. For the display devices, as the flat panel display has advanced features such as high image quality, high space utilization efficiency, low power consumption, and no radiation, etc., it has become the main stream in the market. The flat panel display in the current market includes liquid crystal display (LCD), organic electro-luminescence display, and plasma display panel (PDP), etc. As the organic electro-luminescence display has advantages such as no viewing angle limit, low fabrication cost, high response speed (about hundreds times of an LCD), power saving, direct current drive, wide range of working temperature, and small volume, etc., it has great developing potential.

FIG. 1 is a schematic diagram of a circuit of a conventional organic electro-luminescence display. Referring to FIG. 1, the conventional organic electro-luminescence display 100 includes a substrate 110, a plurality of scan lines 120, a plurality of data lines 130, a plurality of power lines 140 and a plurality of display units 150. The scan lines 120 and the data lines 130 are disposed upon the substrate 110, so as to drive the corresponding display units 150, and the display units 150 are electrically connected to a power P through the power lines 140.

As shown in FIG. 1, the display unit 150 includes a switching thin film transistor (switching TFT) 152, a driving TFT 154, an organic electro-luminescence device 156 and a capacitor 158. In FIG. 1, the scan line 150 is electrically connected to a gate 152a of the switching TFT 152, and the data line 130 is electrically connected to a source 152b of the switching TFT 152, and a drain 152c of the switching TFT 152 is electrically connected to the gate 154a of the driving TFT 154. Moreover, the source 154b of the driving TFT 154 is electrically connected to the power line 140, and the drain 154c of the driving TFT 154 is electrically connected to the organic electro-luminescence device 156. In addition, the capacitor 158 is electrically connected between the gate 154a of the driving TFT 154 and the power line 140.

In detail, after the switching TFT 152 is turned on by the output voltage of the scan line 120, the data line 130 can transmit the voltage signal to the gate 154a of the driving TFT 154, so as to activate the driving TFT 154. Accordingly, the power can be provided to the organic electro-luminescence device 156 through the power line 140 and the driving TFT 154, so that the organic electro-luminescence device 156 can display. Moreover, the voltage signal transmitted through the data line 130 can control the channel (not shown) of the driving TFT 154, so as to further control the amount of the current passing through the driving TFT 154. Accordingly, the luminescence intensity of the organic electro-luminescence device 156 is controlled appropriately, so that the organic electro-luminescence display 100 can display correct images.

In FIG. 1, the driving TFT 154 is an important role in the display unit 150. When the fabrication of the driving TFT 154 fails due to the neglect in fabricating process, the display quality of the entire organic electro-luminescence display 100 will be deteriorated significantly.

SUMMARY OF THE INVENTION

Accordingly, the invention is directed to provide a repairable pixel structure, which keeps the possibility of repairing so as to avoid failure of the pixel structure.

Another aspect of the invention is to provide a repairable organic electro-luminescence display unit, which keeps the possibility of repairing so as to avoid failure of the pixel structure.

Another aspect of the invention is to provide a repairing method for the pixel structure, so as to avoid the problem that the pixel structure can not display normally because of the neglect in the fabricating process.

Another aspect of the invention is to provide a repairing method for the organic electro-luminescence display unit, so as to avoid the problem that the pixel structure can not display normally due to the neglect in the fabricating process.

In order to achieve the above and other aspects, the invention provides a pixel structure, which is suitable for electrically connected to a scan line, a data line and a power line. The pixel structure includes a current control unit, a pixel electrode and a redundant active device. The current control unit is electrically connected to the scan line, the data line and the power line. Moreover, the pixel electrode is electrically connected to the current control unit, and the redundant active device is electrically connected to the pixel electrode and the current control unit, and the redundant active device is electrically insulated from the power line.

The invention provides an organic electro-luminescence display unit, which is suitable for electrically connected to a scan line, a data line and a power line. The organic electro-luminescence display unit includes the abovementioned pixel structure, an organic electro-luminescence layer and an electrode layer. The organic electro-luminescence layer is disposed above the pixel electrode, and the electrode layer is disposed above the organic electro-luminescence layer.

The invention provides a method of repairing the pixel structure, suitable for repairing the above-described pixel structure. The method for repairing the pixel structure includes the following steps: first, cutting an electrical connection between the current control unit and the power line; then after, the power line is electrically connected to the redundant active device, so that the current control unit and the redundant active device can control the current provided by the power line.

The invention provides a method of repairing the organic electro-luminescence display unit, suitable for repairing the above-mentioned organic electro-luminescence display unit. The method for repairing the organic electro-luminescence display unit includes the following steps: first, cutting an electrical connection between the current control unit and the power line; then, the power line is electrically connected to the redundant active device, so that the current control unit and the redundant active device can control the current passing through the organic electro-luminescence layer.

As the organic electro-luminescence display unit and the pixel structure of the invention have the redundant active device electrically insulated from the power line, therefore, when the second active device fails, the redundant active device can substitute the invalid second active device by repairing mechanism (for example, laser cutting, laser welding), so that the organic electro-luminescence display unit and the pixel structure can normally display.

In order to the make the aforementioned and other features and advantages of the invention comprehensible, an embodiment accompanied with figures is described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

The First Embodiment

Figure 1:
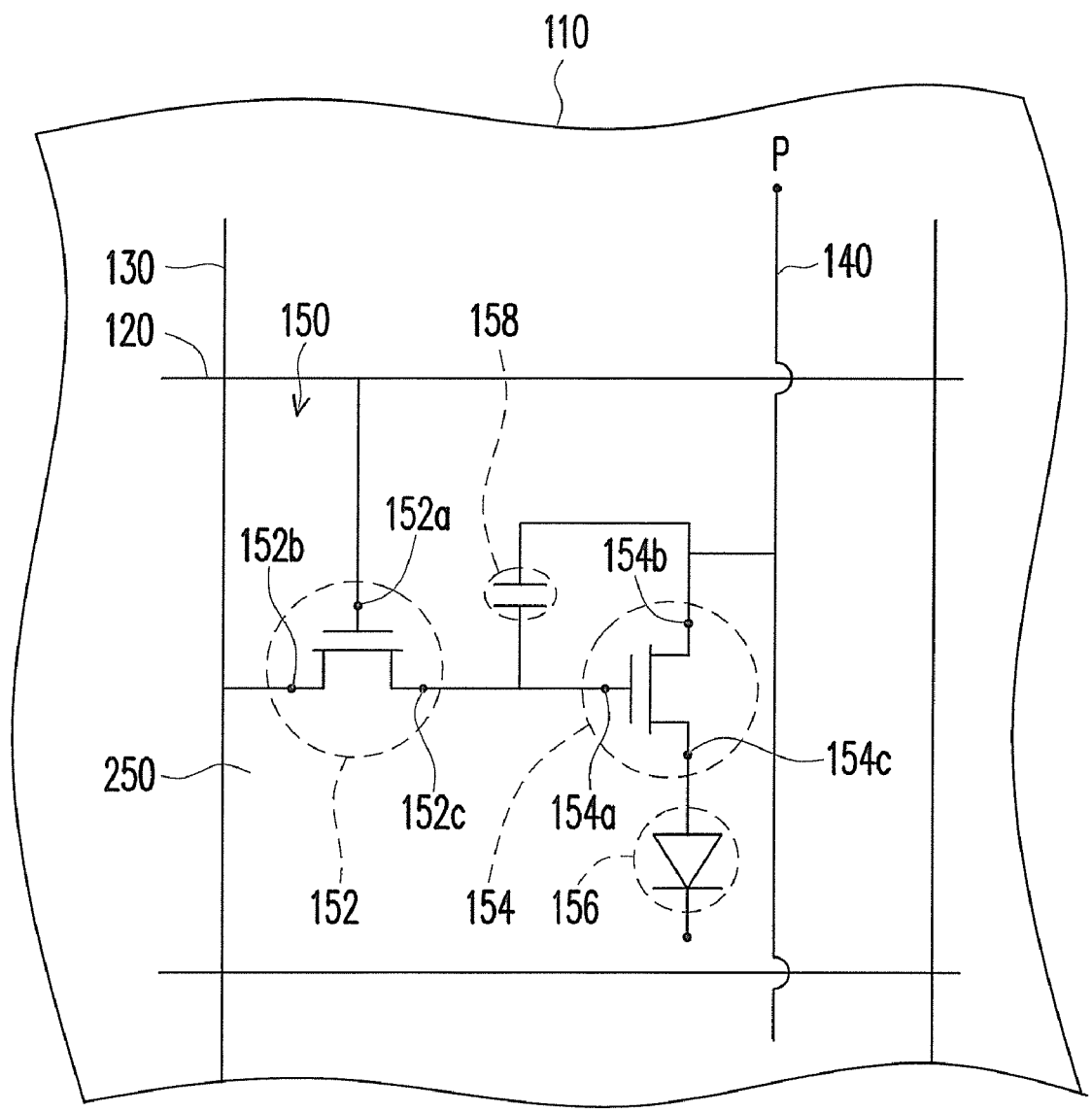
FIG. 1 is a schematic diagram of the circuit of a conventional organic electro-luminescence display.
Figure 2:
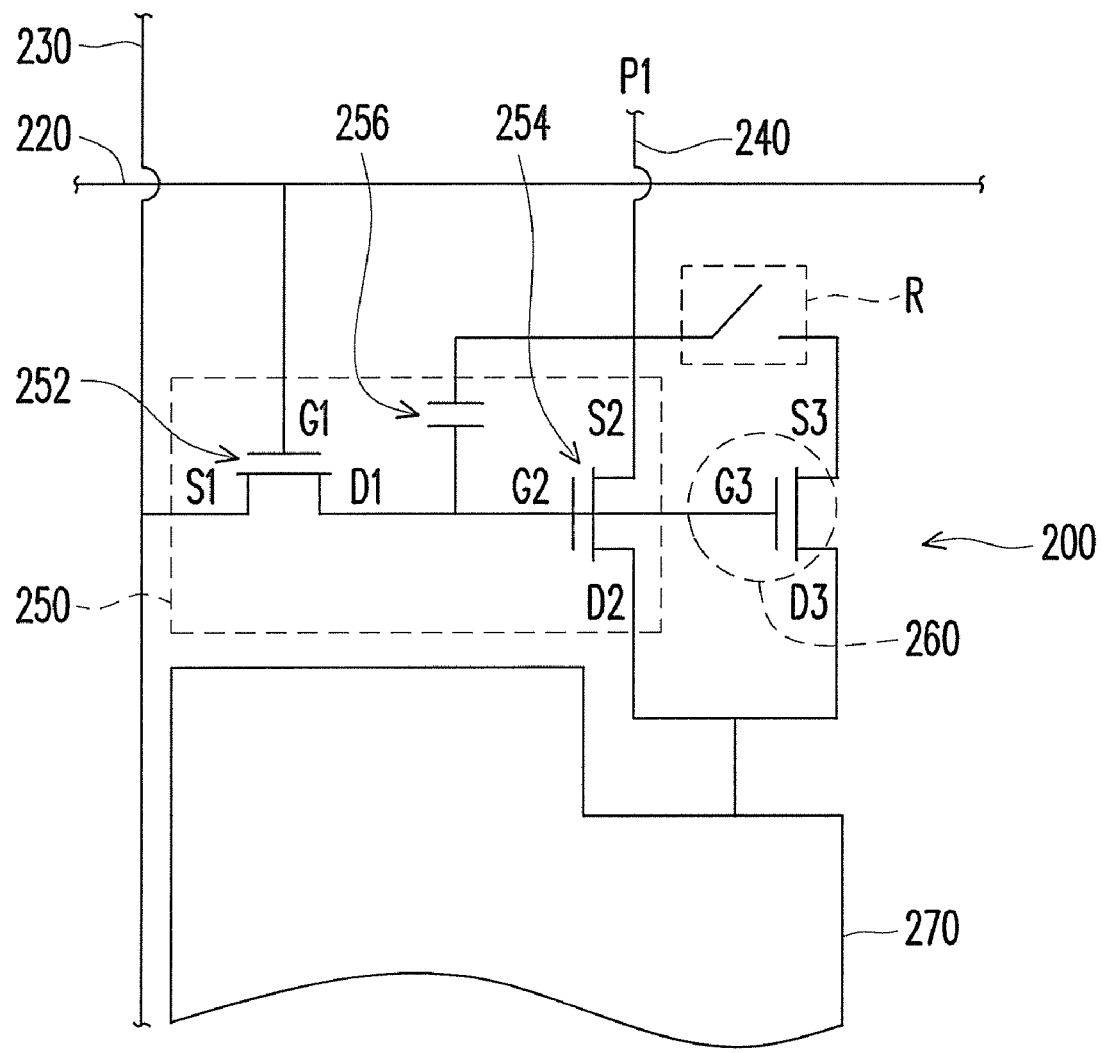
FIG. 2 is a schematic diagram of the circuit of the pixel structure according to the first embodiment of the invention.

FIG. 2 is a schematic diagram of a circuit of the pixel structure according to the first embodiment of the invention.

Referring to FIG. 2, the pixel structure 200 of the invention is electrically connected to a scan line 220, a data line 230 and a power line 240, and the power line 240 is electrically connected to a power P1. The pixel structure 200 of the invention includes a current control unit 250, a redundant active device 260 and a pixel electrode 270. The current control unit 250 is electrically connected to the scan line 220, the data line 230 and the power line 240. In addition, the pixel electrode 270 is electrically connected to the current control unit 250. The redundant active device 260 is electrically connected to the pixel electrode 270 and the current control unit 250. It is noted that the redundant active device 260 is electrically insulated from the power line 240. In the invention, the redundant active device 260 is normally electrically insulated from the power line 240 when the current control unit 250 operates normally. When the current control unit 250 fails, the redundant active device 260 may be switched to electrically connect the current control unit 250 by laser repairing process, so as to ensure that the pixel structure 200 can operate normally.

In detail, the scan line 220 and the data line 230 can transmit the signal to the current control unit 250, so that the current control unit 250 can control the current provided to the pixel electrode 270 from the power P1. It is noted that the current control unit 250 may be the common design of two transistors and one capacitor, namely the 2T1C in the industry, the design of three transistors and one capacitor (3T1C), the design of three transistors and two capacitors (3T2C), or other device assembly that can suitably control the current, which are not limited here.

In one embodiment, the current control unit 250 may include a first active device 252, a second active device 254 and one capacitor 256. In detail, the gate G1 of the first active device 252 is electrically connected to the scan line 220, and the source S1 of the first active device 252 is electrically connected to the data line 230. Moreover, the voltage signal transmitted through the scan line 220 can turn on the first active device 252, and the voltage signal transmitted through the data line 230 can be transmitted to the second active device 254 through the first active device 252.

Moreover, the gate G2 of the second active device 254 is electrically connected to the drain D1 of the first active device 252, and the source S2 of the second active device 254 is electrically connected to the power line 240. In addition, the capacitor 256 is electrically connected between the gate G2 of the second active device 254 and the power line 240. It can be learned clearly from FIG. 2 that the current control unit 250 is electrically connected to the pixel electrode 270, and the current control unit 250 can control the size of the current input to the pixel electrode 270. In detail, the voltage signal transmitted through the data line 230 can control the channel of the second active device 254, so that the amount of the current transmitted to the pixel electrode 270 through the second active device 254 can be controlled. In addition, the redundant active device 260 is electrically connected to the pixel electrode 270 and the current control unit 250. It is noted that the redundant active device 260 is electrically insulated from the power line 240. In other words, the current can not be transmitted to the redundant active device 260 through the power line 240.

Figure 3:
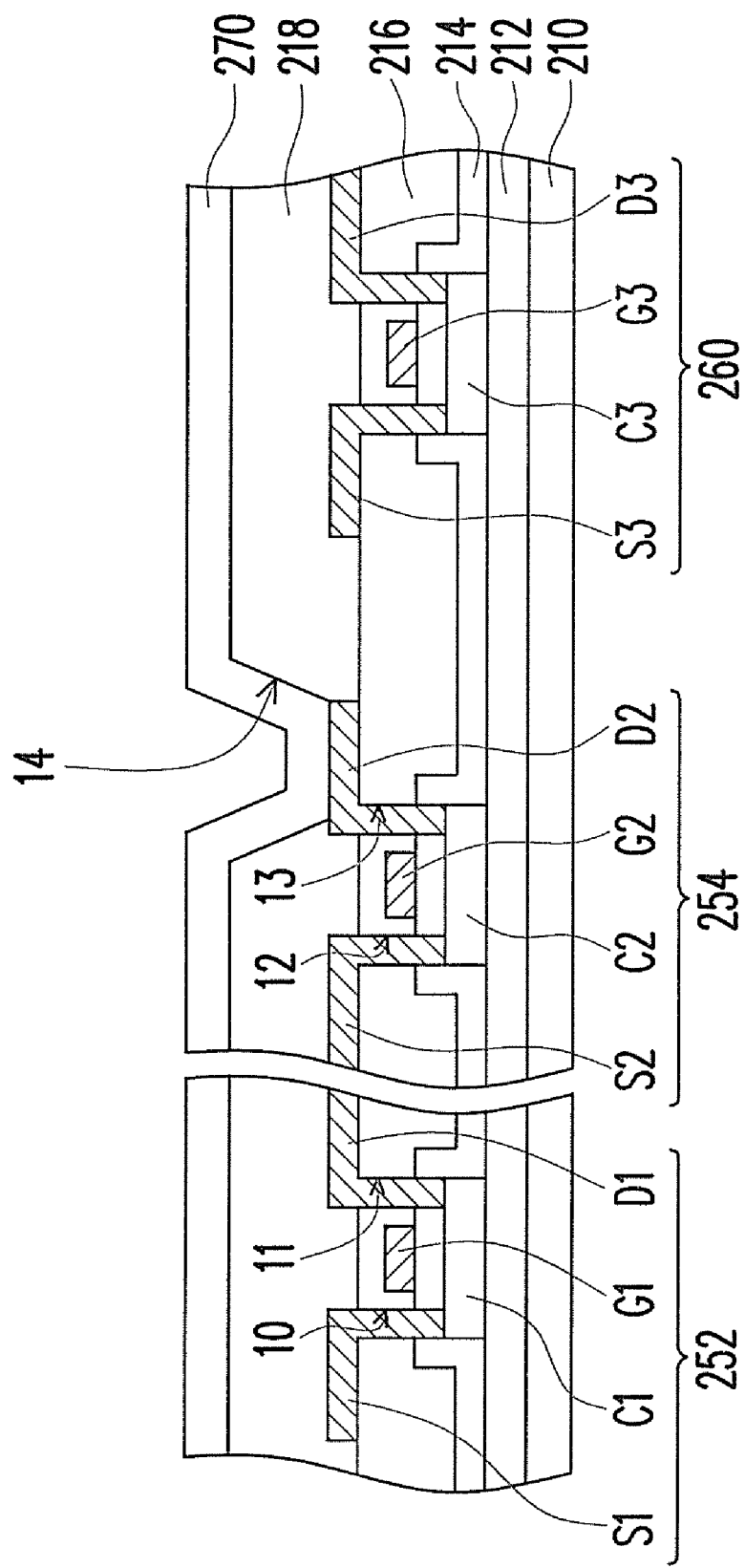
FIG. 3 is a schematic cross-sectional diagram of the pixel structure according to the first embodiment of the invention.

FIG. 3 is a schematic cross-sectional diagram of the pixel structure according to the first embodiment of the invention. Referring to FIG. 3, the first active device 252, the second active device 254, and the abovementioned redundant active device 260 can apply the top gate transistor. The redundant active device 260 can select the same device as the second active device 254. In other words, the redundant active device 260 can be fabricated above the substrate 210 together with the second active device 254 by the same fabrication process, so that no additional fabrication process is needed to make the redundant active device 260. In general, a buffer layer 212 is formed between the first active device 252, the second active device 254, the redundant active device 260 and the substrate 210; and a protection layer 218 covers above the first active device 252, the second active device 254, and the redundant active device 260.

In detail, the first active device 252 is, for example, a thin film transistor (TFT). The first active device 252 mainly includes a first gate G1, a first source S1, a first drain D1, and a first channel layer C1. In general, a gate insulation layer 214 is disposed between the first gate G1 and the first channel layer C1, and a dielectric layer 216 covers the first gate G1 and the gate insulation layer 214. In addition, the first source S1 and the first drain D1 are electrically connected to the first channel layer C1 through the contact openings 10, 11 disposed in the dielectric layer, respectively. The first gate G1 is electrically connected to the scan line 220 (as shown in FIG. 2), and the first source S1 is electrically connected to the data line 230 (as shown in FIG. 2).

The second active device 254 of the invention is, for example, a TFT, and the second active device 254 mainly includes a second gate G2, a second source S2, a second drain D2, and a second channel layer C2. The second gate G2 is electrically connected to the first drain D1 (as shown in FIG. 2), and the second source S2 is electrically connected to the power line 240 (as shown in FIG. 2), and the second source S2 and the second drain D2 are electrically connected to the second channel layer C2 through the contact openings 12, 13, respectively. In addition, the second drain D2 is electrically connected to the pixel electrode 270 through a contact opening 14 disposed in the protection layer 218.

The redundant active device 260 of the invention is, for example, a TFT, and the redundant active device 260 mainly includes a third gate G3, a third source S3, a third drain D3, and a third channel layer C3. The third gate G3 is electrically connected to the first drain D1. It is noted that the third source S3 is electrically insulated from the power line 240 (as shown in FIG. 2), and the third drain D3 is electrically connected to the pixel electrode 270 (as shown in FIG. 2).

It is noted that all of the first active device 252, the second active device 254 and the redundant active device 260 can be N type TFTs made by NMOS fabrication process. Of course, it is not limited here, and all of the first active device 252, the second active device 254 and the redundant active device 260 can also be P type TFTs made by pMOS fabrication process. In addition, the first active device 252 can also be an N type TFT made by NMOS fabrication process, and both of the second active device 254 and the redundant active device 260 can be P type TFTs made by pMOS fabrication process; of course, the first active device 252 can also be a P type TFT made by pMOS fabrication process, and both of the second active device 254 and the redundant active device 260 can be N type TFTs made by nMOS fabrication process.

The material of the pixel electrode 270 is, for example, transparent material such as indium tin oxide (ITO) or indium zinc oxide (IZO), etc., and the pixel structure 200 is suitable for the bottom emission OLED (to be described in the second embodiment). When the pixel electrode 270 is a reflective material, the pixel structure 200 may be suitable for a top emission OLED. Thus, the description of the pixel structure 200 of the invention is primarily completed.

Figure 4:
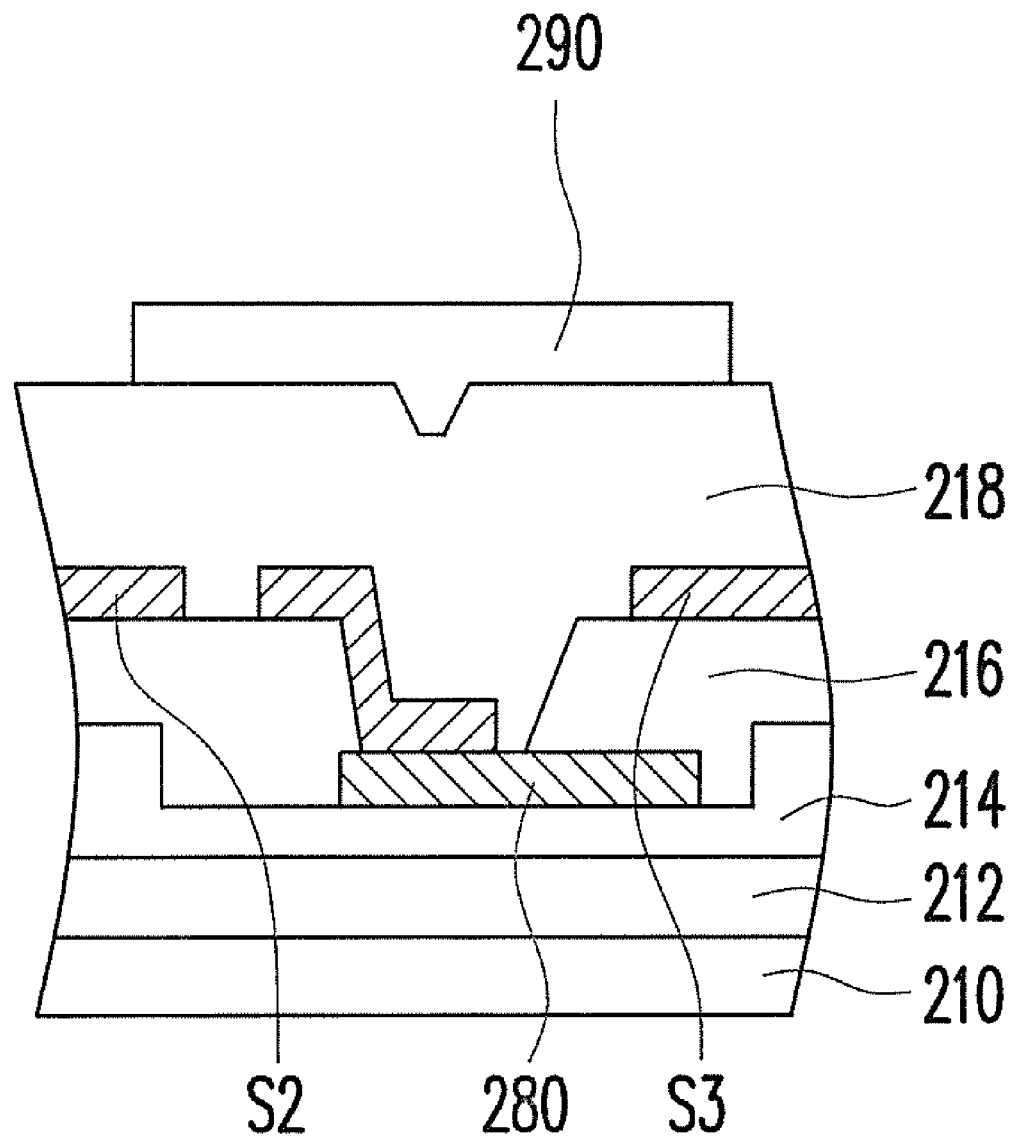
FIG. 4 is a schematic local cross-sectional diagram of the repairing region R shown in FIG. 2.

FIG. 4 is a schematic cross-sectional diagram of the repairing region R shown in FIG. 2. Referring to FIG. 4, the pixel structure 200 of the present embodiment may further include a repairing conductive layer 280, and the repairing conductive layer 280 is electrically connected to the power line 240 (as shown in FIG. 2) through the second source S2, and a partial region of the third source S3 may be disposed above the repairing conductive layer 280. It can be learned clearly from FIG. 4 that the redundant active layer 260 of the invention is electrically insulated from the repairing conductive layer 280.

Figure 5A:
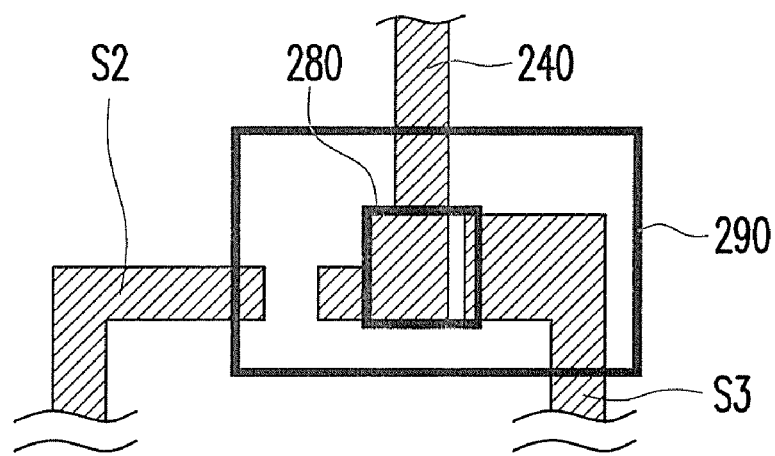
FIGS. 5A-5B are the schematic diagrams of the repairing process of the repairing region R shown in FIG. 2.
Figure 6A:
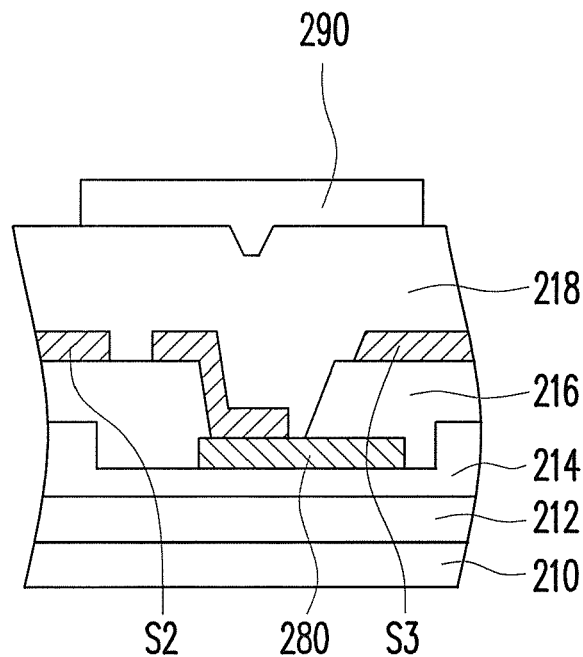
FIGS. 6A-6B are the schematic cross-sectional diagrams showing the repairing process of the repairing region R shown in FIG. 2.

When inferior fabrication or damage happens in the fabrication of the second active device 254, the following repairing process can be performed:

FIG. 5A is a schematic diagram of the repairing process of the repairing region R shown in FIG. 2. Referring to FIG. 2 and FIG. 5A, the electrical connection between the current control unit 250 and the power line 240 is cut off. In more detail, the current control unit 250 is electrically insulated from the power line 240 by cutting the second source S2 and the power line 240, and the cutting method is, for example, laser cutting. Referring to FIG. 6A, the method of separating the second source S2 and the power line 240 is, for example, by laser transiting the back surface (the surface of the substrate 210 without device) of the substrate 210 so as to cut the second source S2 and the power line 240.

Figure 5B:
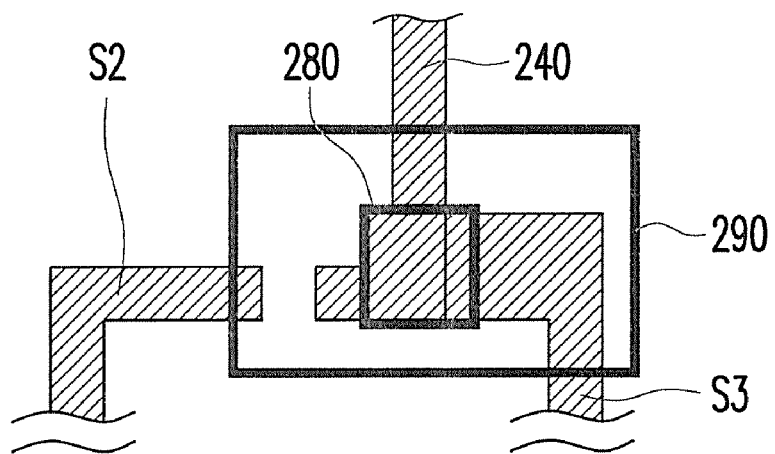
Figure 6B:
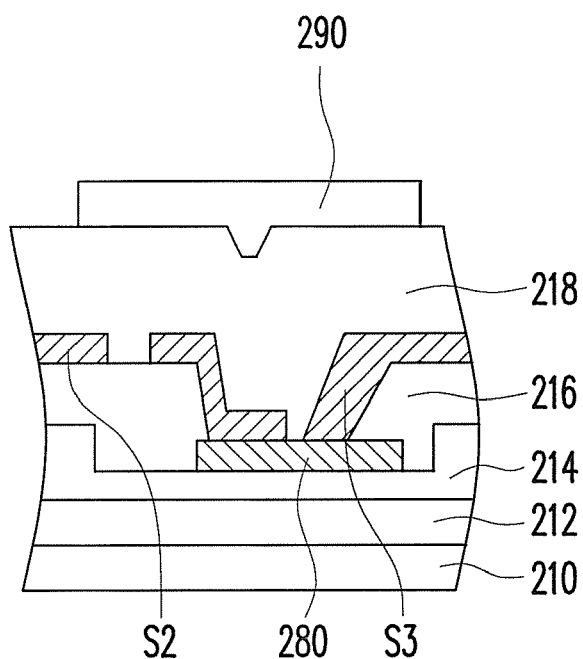

FIG. 5B is a schematic diagram of the repairing process of the repairing region R shown in FIG. 2. Referring to FIG. 2 and FIG. 5B simultaneously, the power line 240 is electrically connected to the redundant active device 260 so that the current provided by the power line 240 can be controlled by the current control unit 250 and the redundant active device 260. Referring to FIG. 6B, the third source S3 of the redundant active device 260 is electrically connected to the power line 240 by electrically connecting with the repairing conductive layer 280, and the method of connecting the third source S3 and the repairing conductive layer 280 is, for example, laser welding.

Figure 7:
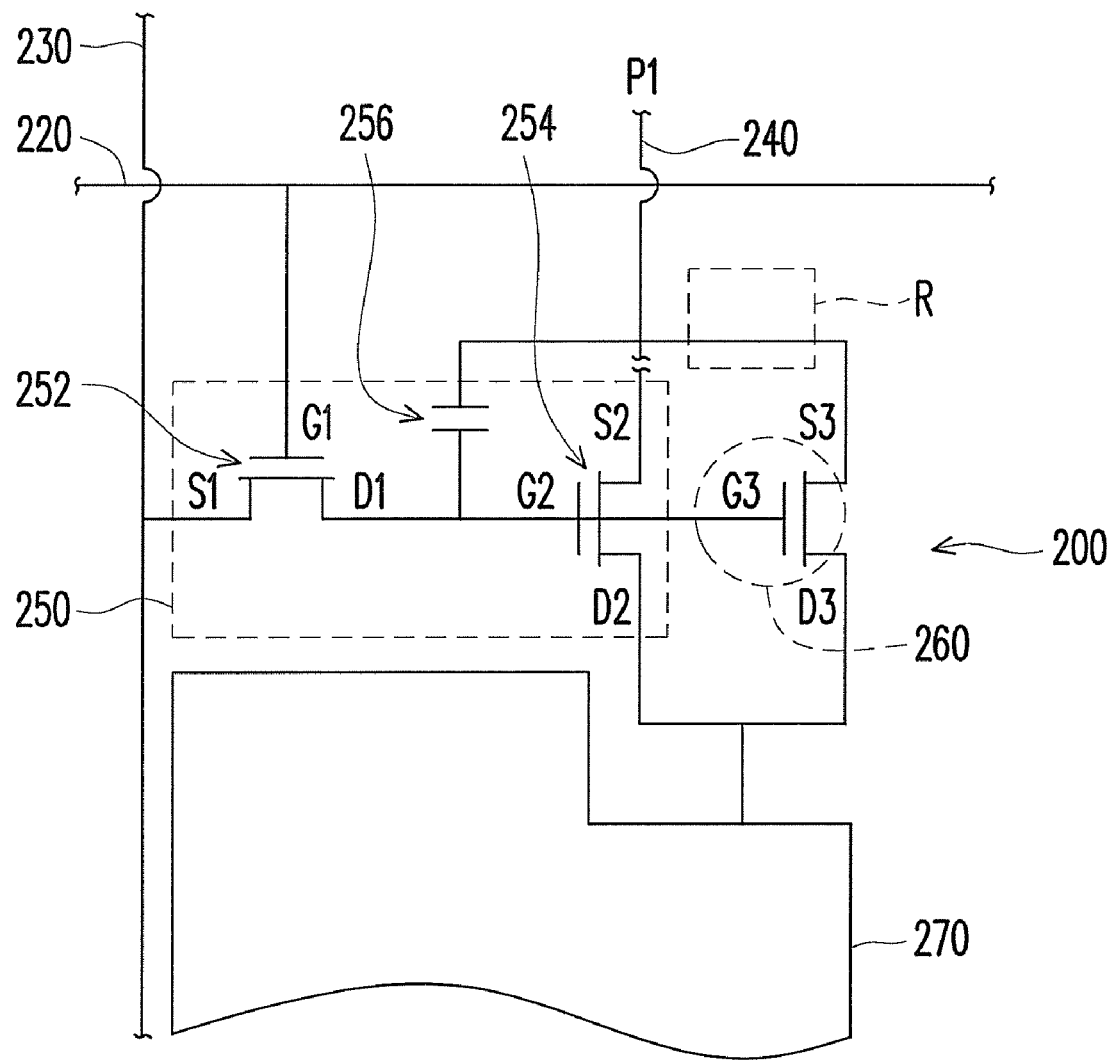
FIG. 7 is a schematic diagram of the circuit after the pixel structure is repaired according to the first embodiment of the invention.

FIG. 7 is a schematic diagram of the circuit after the pixel structure is repaired according to the first embodiment of the invention. Referring to FIG. 7, the repairing method has the redundant active device 260 electrically connected to the power line 240 so as to substitute the second active device 254, and further to keep the original function of the entire pixel structure 200.

Referring to FIG. 4, the pixel structure 200 of the invention may further include a block layer 290, disposed above the repairing conductive layer 280, a partial region of the second source S2, and a partial region of the third source S3. The block layer 290 has a coverage range of is substantially greater than the coverage range of the repairing conductive layer 280. In other words, the area of the block layer 290 is substantially greater than that of the repairing conductive layer 280. In detail, the main function of the block layer 290 is to block the laser radiated from the back surface of the substrate 210 when the pixel structure 200 is repaired by laser, and further to avoid the laser damaging other film layers that do not need to be repaired. It is noted that in the fabrication process of the organic electro-luminescence display unit, if inferior fabrication happens in the fabrication process of the pixel structure 200, the pixel structure 200 can be repaired at once. Accordingly, it can avoid the inferior pixel structure 200 being continuously performed in the successive fabrication process, so that the fabrication cost is saved.

The Second Embodiment

Figure 8:
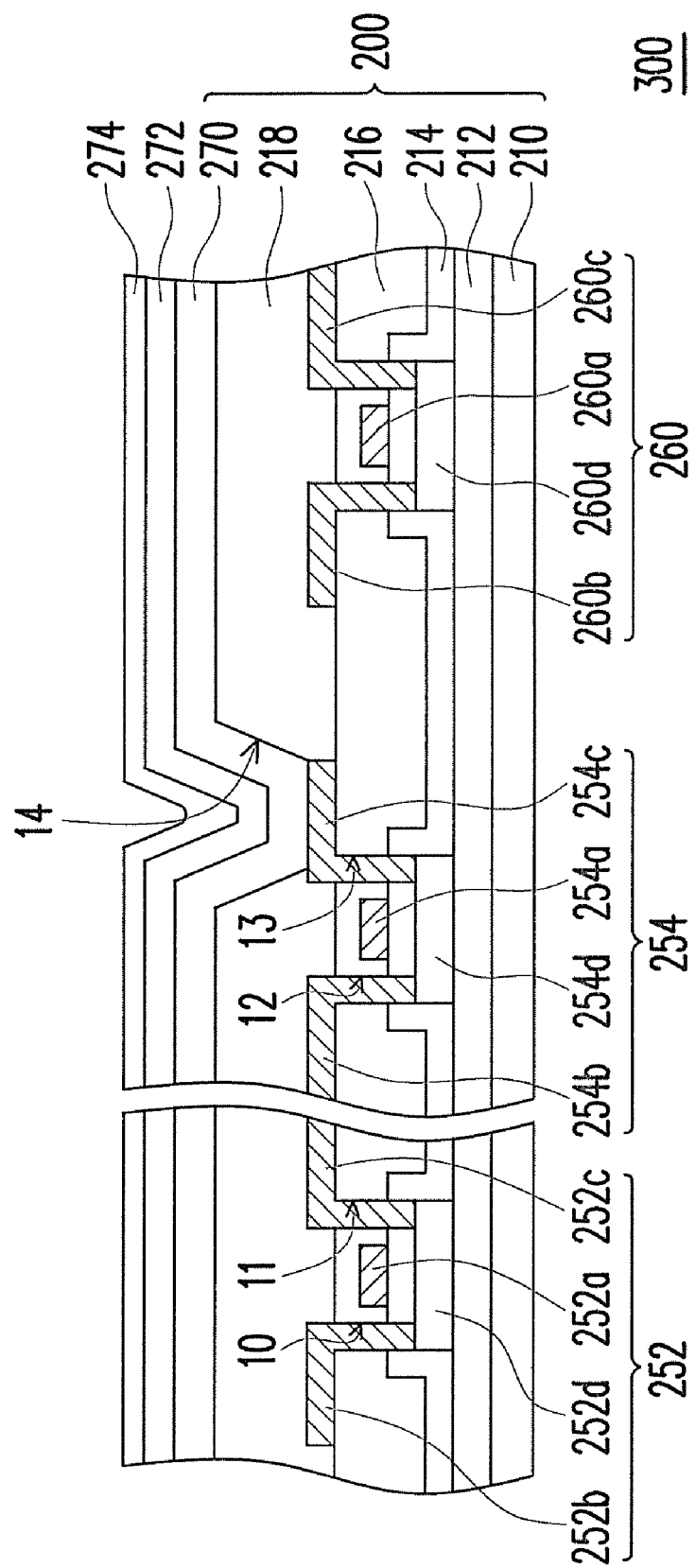
FIG. 8 is a schematic cross-sectional diagram of the organic electro-luminescence display unit according to the second embodiment of the invention.
Figure 9A:
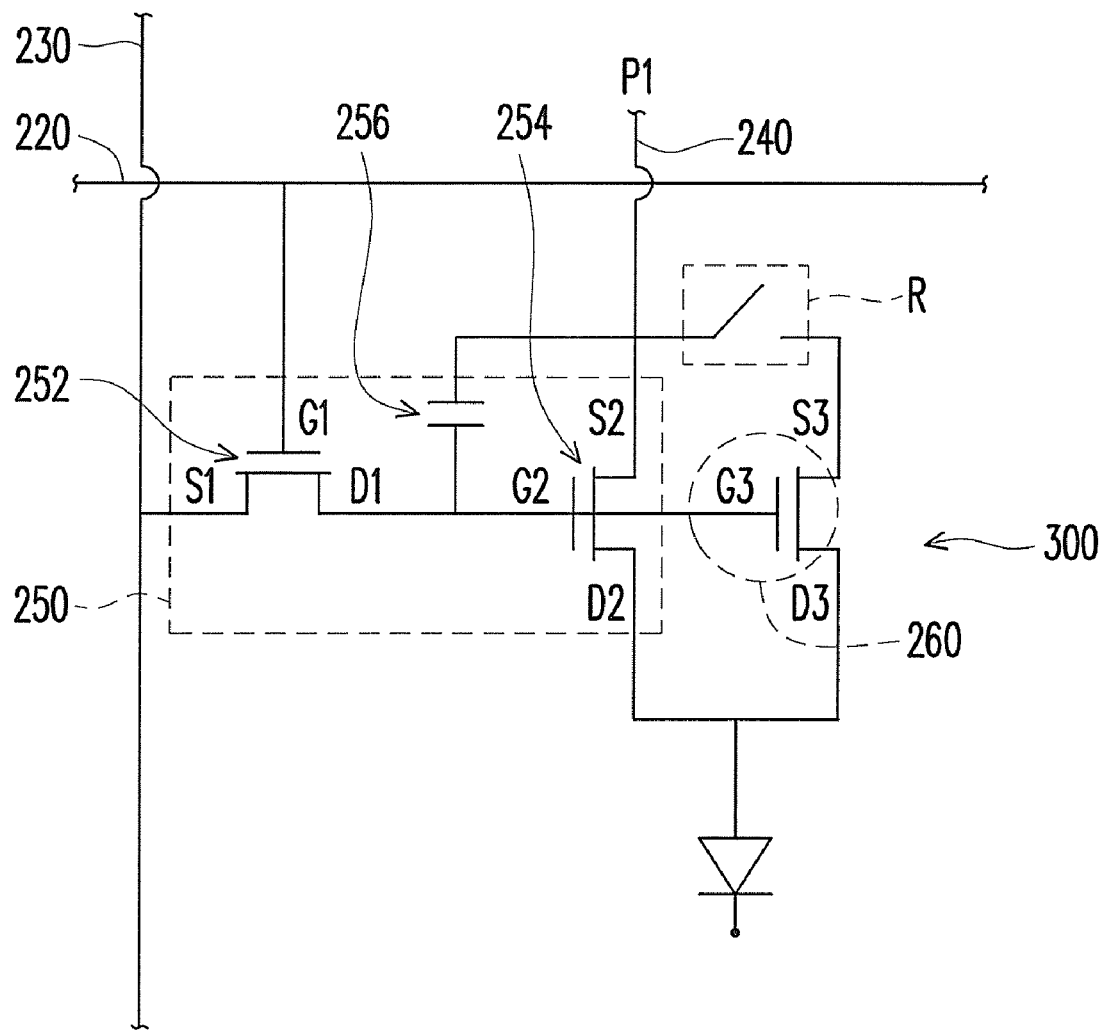
FIG. 9A is a schematic diagram of the circuit of the organic electro-luminescence display unit according to the second embodiment of the invention.

FIG. 8 is a schematic cross-sectional diagram of the organic electro-luminescence display unit according to the second embodiment of the invention, and FIG. 9A is a schematic diagram of the circuit of the organic electro-luminescence display unit according to the second embodiment of the invention. Referring to FIG. 8 and FIG. 9A simultaneously, the organic electro-luminescence 300 of the invention includes a pixel structure 200, an organic electro-luminescence layer 272, and an electrode layer 274. The pixel structure 200 has been disclosed clearly in the first embodiment, the organic electro-luminescence layer 272 is disposed above the pixel electrode 270, and the electrode layer 274 is disposed above the organic electro-luminescence layer 272.

The pixel electrode 270, the organic electro-luminescence layer 272 and the electrode 274 can form an organic electro-luminescence unit. In detail, when the material of the pixel electrode 270 is, for example, a reflective material, the electrode layer 274 is transparent material such as ITO, or IZO, etc., so that the organic electro-luminescence display unit (OLED) 300 is a top emission OLED 300.

When the material of the pixel electrode 270 is, for example, transparent material such as ITO, or IZO, etc., the electrode layer 274 is a reflective material, and the organic electro-luminescence display unit 300 is a bottom emission OLED 300.

Figure 9B:
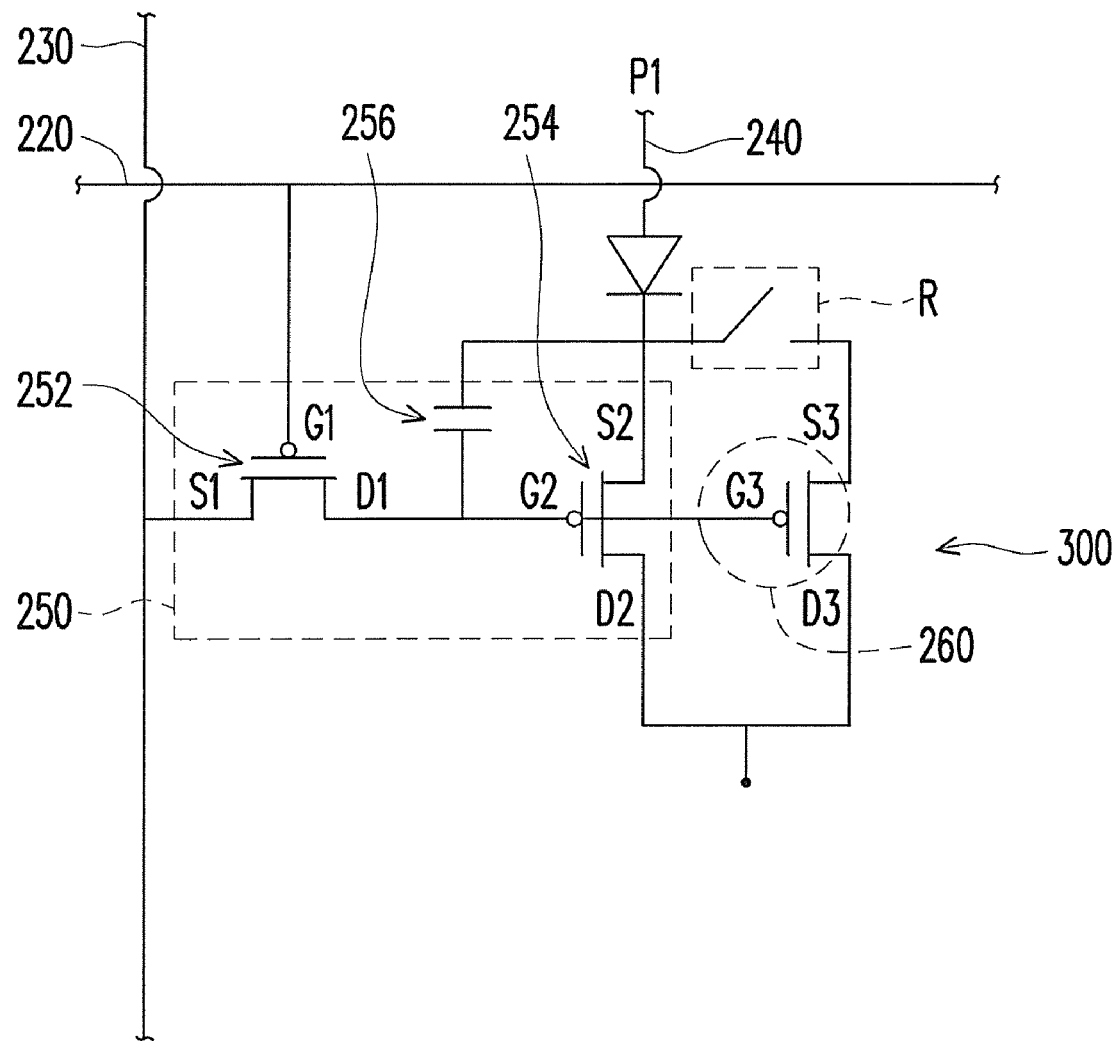
FIGS. 9B-9D are the schematic diagrams of the circuit of another type of organic electro-luminescence display unit according to the second embodiment of the invention.
Figure 9C:
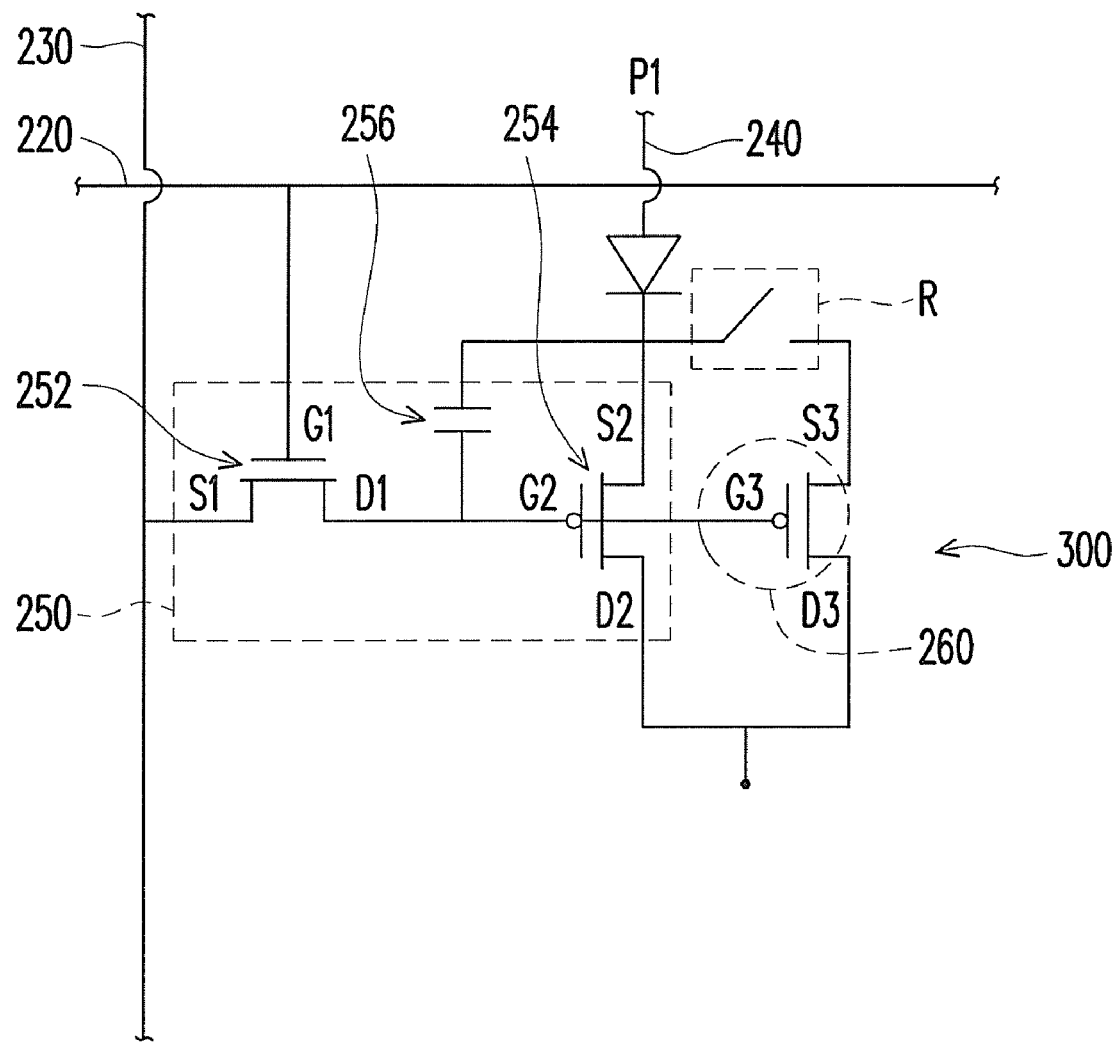
Figure 9D:
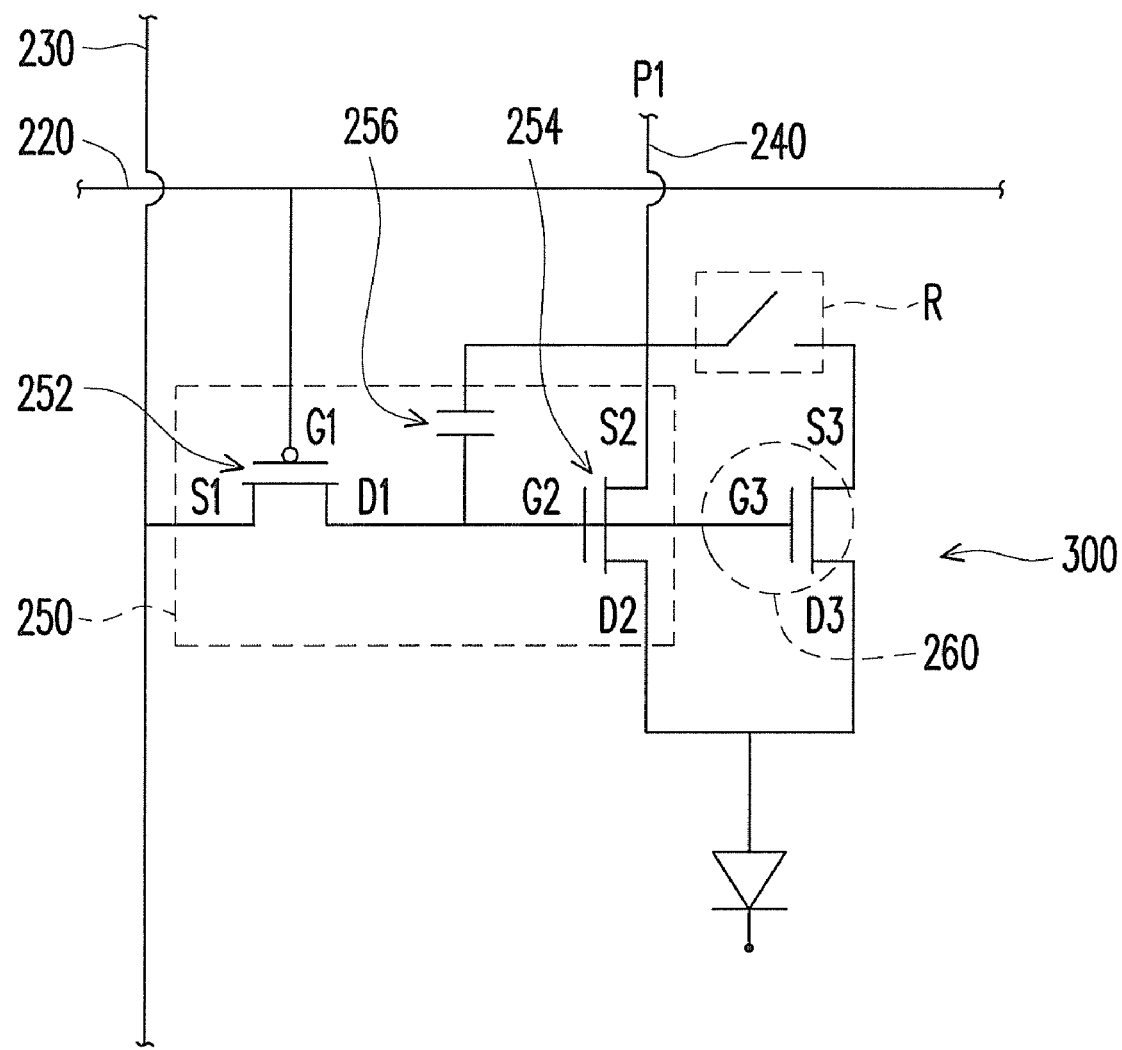

The first active device 252, the second active device 254 and the redundant active device 260 can be N type TFTs made by nMOS fabrication process. Of course, it is not limited here, and all of the first active device 252, the second active device 254 and the redundant active device 260 can also be P type TFTs made by pMOS fabrication process as shown in FIG. 9B; and the above-described organic electro-luminescence device is electrically connected between the second source S2 and the power P1. Referring to FIG. 9C, the first active device 252 can also be an N type TFT made by NMOS fabrication process, and both of the second active device 254 and the redundant active device 260 can be P type TFTs made by pMOS fabrication process. Referring to FIG. 9D, the first active device 252 can also be a P type TFT made by pMOS fabrication process, and both of the second active device 254 and the redundant active device 260 can be N type TFTs made by nMOS fabrication process.

It can be learned clearly from FIG. 8 that the second drain D2 of the second active device 254 is electrically connected to the pixel electrode 270, the organic electro-luminescence layer 272 and the electrode 274 (organic electro-luminescence diode) through the contact opening 14. It is noted that the third source S3 of the redundant active device 260 is electrically insulated from the power line 240. Although it can not be shown in FIG. 8 and FIG. 9A, actually, the third drain D3 of the redundant active device 260 is electrically connected to the pixel electrode 270.

Figure 10:
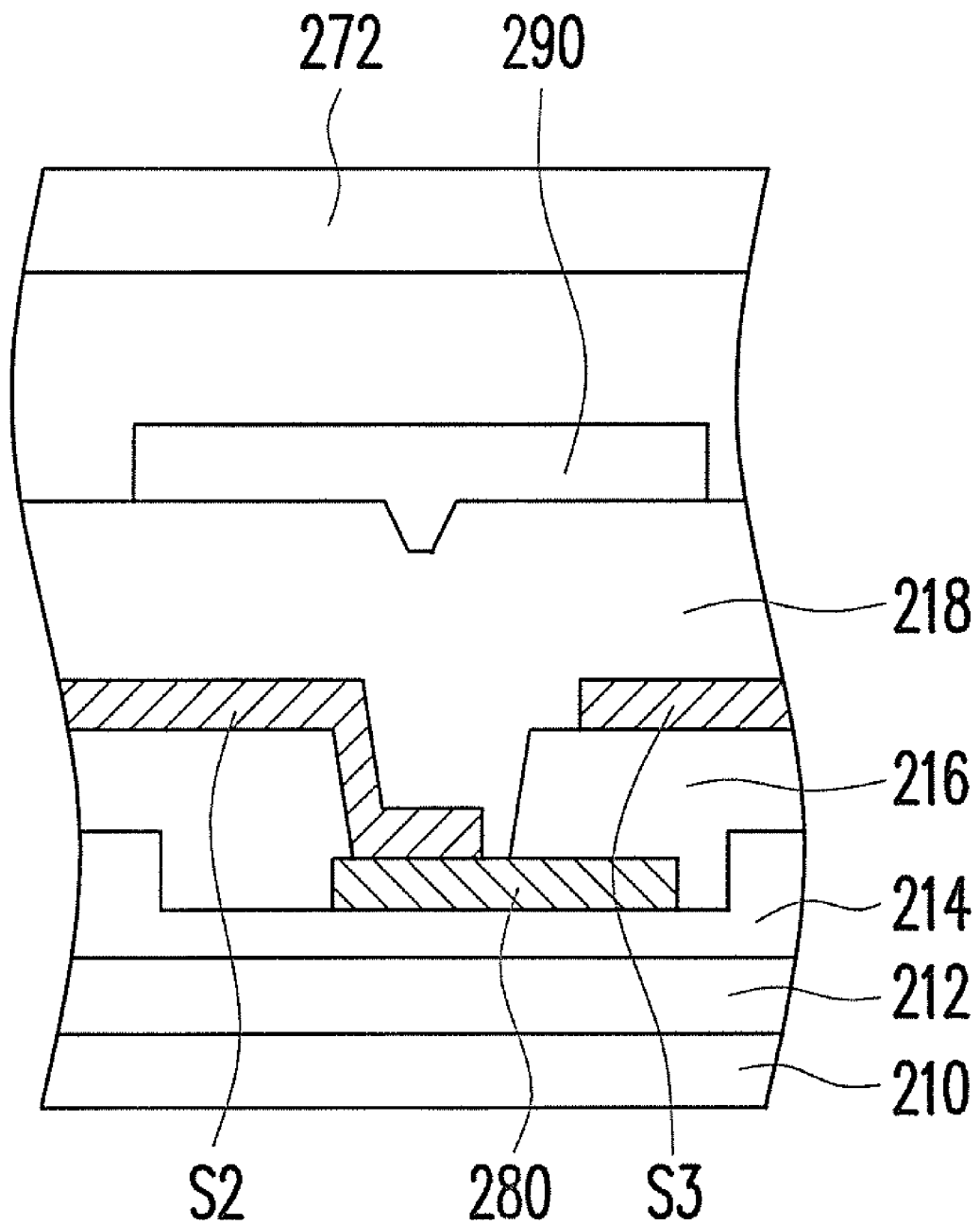
FIG. 10 is a schematic cross-sectional diagram of the repairing region R shown in FIG. 9A.

FIG. 10 is a local schematic cross-sectional diagram of the repairing region R shown in FIG. 9A. Referring to FIG. 10, the organic electro-luminescence display unit 300 of the embodiment may further include a repairing conductive layer 280, and the repairing conductive layer 280 is electrically connected to the power line 240. Moreover, the second source S2 is electrically connected to the power line 240 through the repairing conductive layer 280, and the repairing conductive layer 280 is electrically connected to the power line 240 through the second source S2 (as shown in FIG. 9A), and a partial region of the third source S3 is disposed above the repairing conductive layer 280. It can be learned clearly from FIG. 10 that the redundant active device 260 of the invention is electrically insulated from the repairing conductive layer 280.

Figure 11A:
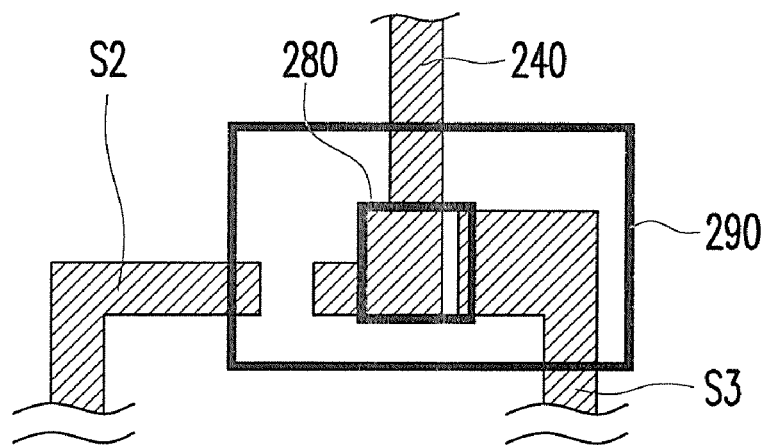
FIGS. 11A-11B are schematic diagrams of the repairing process of the repairing region R shown in FIG. 9A.
Figure 12A:
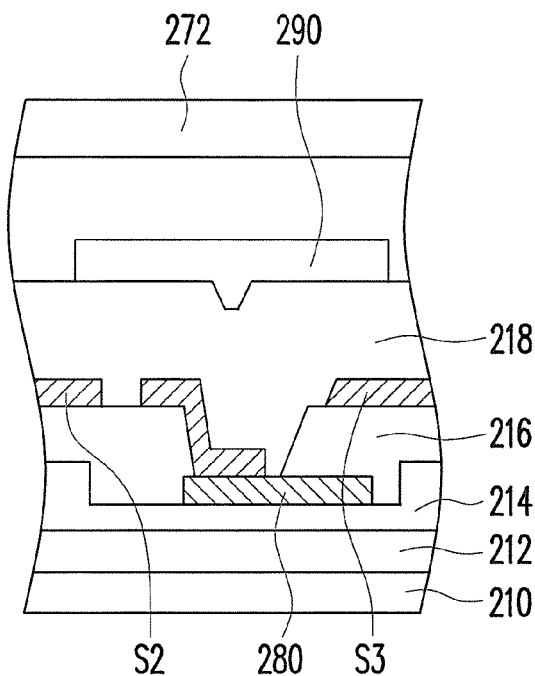
FIGS. 12A-12B are schematic cross-sectional diagrams of the repairing process of the repairing region R shown in FIG. 9A.

When an inferior fabrication or damage happens in the fabrication of the second active device 254 (as shown in FIG. 9A), the following repairing process can be performed:

FIG. 11A is a schematic diagram of the repairing process of the repairing region R shown in FIG. 9A. Referring to FIG. 9A and FIG. 11A simultaneously, the electrical connection between the current control unit 250 and the power line 240 is cut off. In detail, the current control unit 250 is electrically insulated from the power line 240 by cutting the second source S2 and the power line 240, and the cutting method is, for example, laser cutting. Referring to FIG. 12A, the method of separating the second source S2 and the power line 240 is, for example, by laser transiting the back surface (the surface of the substrate 210 without device) of the substrate 210 so as to cut the second source S2 and the power line 240.

Figure 11B:
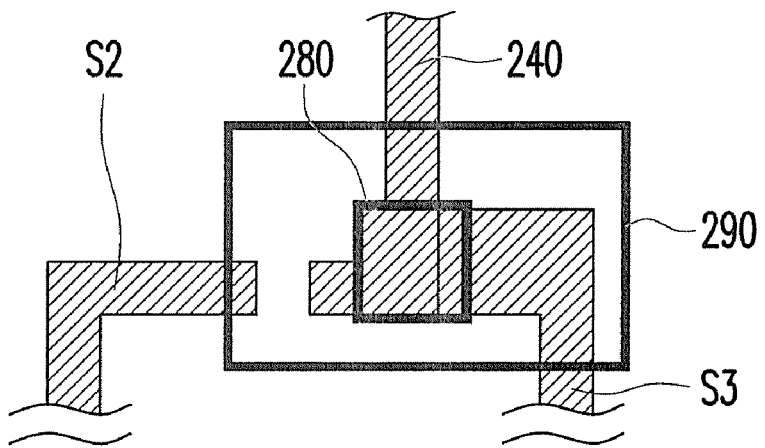
Figure 12B:
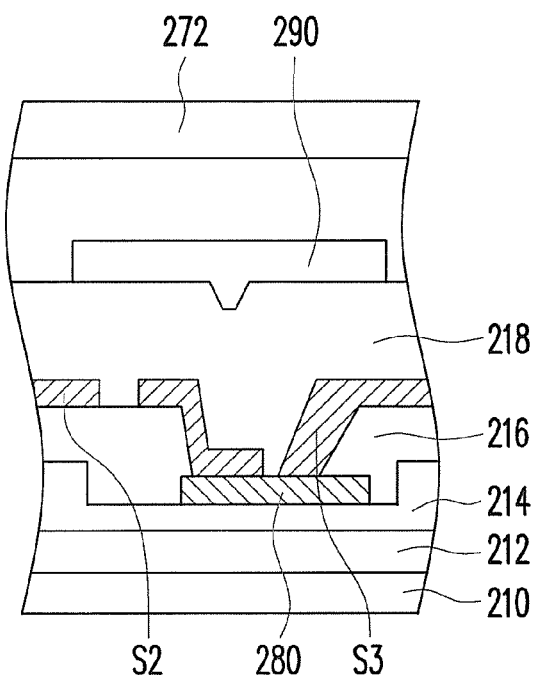

FIG. 11B is a schematic diagram of the repairing process of the repairing region R shown in FIG. 9A. Referring to FIG. 9A and FIG. 11B simultaneously, the power line 240 is electrically connected to the redundant active device 260 so that the current provided by the power line 240 can be controlled by the current control unit 250 and the redundant active device 260. Referring to FIG. 12B, the third source S3 of the redundant active device 260 is electrically connected to the power line 240 by electrically connecting with the repairing conductive layer 280, and the method of connecting the third source S3 and the repairing conductive layer 280 is, for example, laser welding.

Figure 13:
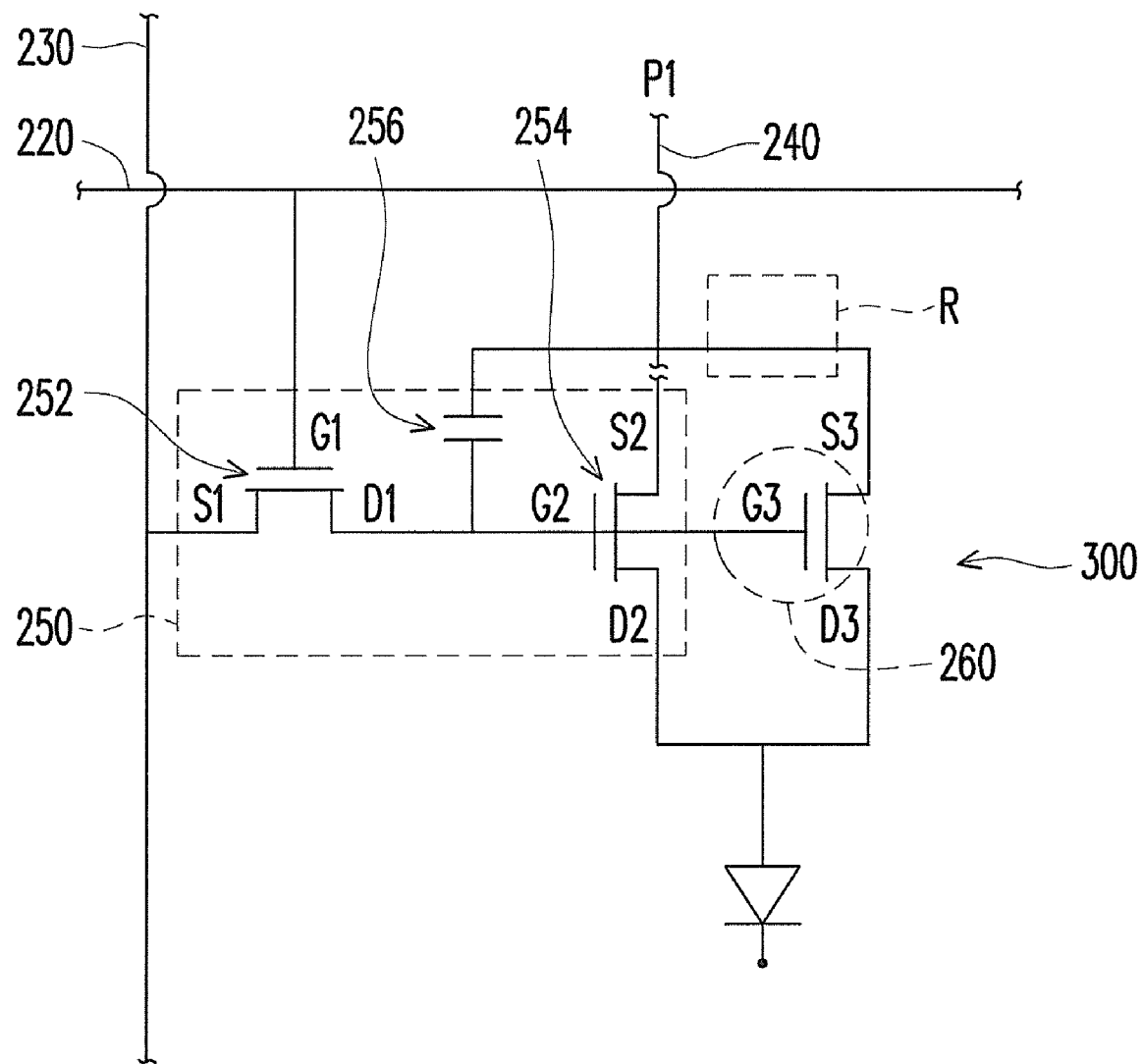
FIG. 13 is a schematic diagram of the circuit after the organic electro-luminescence display unit is repaired according to the second embodiment of the invention.

FIG. 13 is a schematic diagram of the circuit after the pixel structure is repaired according to the second embodiment of the invention. In FIG. 13, the abovementioned repairing method has the redundant active device 260 electrically connected to the power line 240 so as to substitute the second active device 254, and further to keep the original function of the organic electro-luminescence display unit 300.

In summary, the organic electro-luminescence display unit and the pixel structure of the invention have the redundant active device and the repairing conducive layer electrically insulated from the power line. When the second active device fails, the second active device can be electrically insulated from the power line by the repairing method of the organic electro-luminescence display unit and the repairing method of the pixel structure of the invention; and the power line can be electrically connected to the redundant active device through the repairing conductive layer. Accordingly, the redundant active device of the invention can substitute the inferior second active device so as to recover the normal function of the pixel structure, and thus the organic electro-luminescence display unit can display normally. The redundant active device of the invention can be made together with the second active device; therefore, no additional fabrication process is needed for the redundant device. After the fabrication process of the pixel structure is completed, if an inferior fabrication of the pixel structure is found, the pixel structure can be repaired at once. Accordingly, it can avoid the inferior pixel structure being continuously processed in the successive fabrication process, so that the fabrication cost can be saved.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:
1. A method for repairing a pixel structure, comprising:
providing a pixel structure electrically connected to a scan line, a data line and a power line, the pixel structure comprising a current control unit, a pixel electrode electrically connected to the current control unit and a redundant active device, the current control unit being electrically connected to the scan line, the data line and the power line, the current control unit comprising a first active device, a second active device and a capacitor, the first active device having a first gate, a first source and a first drain, the first gate being electrically connected to the scan line, and the first source being electrically connected to the data line, the second active device having a second gate, a second source and a second drain, the second gate being electrically connected to the first drain, the second source being electrically connected to the power line, and the second drain being electrically connected to the pixel electrode, the capacitor being electrically connected between the second gate and the power line, the redundant active device being electrically connected to the pixel electrode and the current control unit and being electrically insulated from the power line, the redundant active device having a third gate, a third source, and a third drain, the third gate being electrically connected to the first drain, the third source being electrically insulated from the power line, and the third drain being electrically connected to the pixel electrode;

cutting an electrical connection between the second source and the power line; and electrically connecting the power line to the third source of the redundant active device, so that the current control unit and the redundant active device control the current provided by the power line.

2. The method of claim 1, wherein the electrical connection between the current control unit and the power line is cut through laser cutting.

3. The method of claim 1, wherein the power line and the redundant active device are electrically connected through laser welding.

4. A method for repairing an organic electro-luminescence display unit, comprising:

providing an organic electro-luminescence display unit electrically connected to a scan line, a data line and a power line, the organic electro-luminescence display unit comprising a current control unit, a pixel electrode electrically connected to the current control unit, a redundant active device an organic electro-luminescence layer disposed above the pixel electrode and an electrode layer disposed above the organic electro-luminescence layer, the current control unit being electrically connected to the scan line, the data line and the power line, the current control unit comprising a first active device, a second active device and a capacitor, the first active device having a first gate, a first source and a first drain, the first gate being electrically connected to the scan line, and the first source being electrically connected to the data line, the second active device having a second gate, a second source and a second drain, the second gate being electrically connected to the first drain, the second source being electrically connected to the power line, and the second drain being electrically connected to the pixel electrode, the capacitor being electrically connected between the second gate and the power line, the redundant active device being electrically connected to the pixel electrode and the current control unit and being electrically insulated from the power line, the redundant active device having a third gate, a third source, and a third drain, the third gate being electrically connected to the first drain, the third source being electrically insulated from the power line, and the third drain being electrically connected to the pixel electrode;

cutting an electrical connection between the second source and the power line; and electrically connecting the power line to the third source of the redundant active device, so that the current control unit and the redundant active device can control the current passing through the organic electro-luminescence.

5. The method of claim 4, wherein the electrical connection between the current control unit and the power line is cut through laser cutting.

6. The method of claim 4, wherein the power line and the redundant active device are electrically connected through laser welding.

* * * * *